(12) United States Patent
Kim et al.

(10) Patent No.: US 11,545,458 B2
(45) Date of Patent: Jan. 3, 2023

(54) SEMICONDUCTOR PACKAGE

(71) Applicant: SAMSUNG ELECTRONICS CO., LTD., Suwon-si (KR)

(72) Inventors: Sun Chul Kim, Hwaseong-si (KR); Tae Hun Kim, Asan-si (KR); Ji Hwan Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 18 days.

(21) Appl. No.: 17/221,304

(22) Filed: Apr. 2, 2021

(65) Prior Publication Data

US 2021/0225796 A1  Jul. 22, 2021

Related U.S. Application Data

(63) Continuation of application No. 16/511,695, filed on Jul. 15, 2019, now Pat. No. 10,971,470.

(30) Foreign Application Priority Data

Oct. 24, 2018 (KR) .......................... 10-2018-0127571

(51) Int. Cl.
*H01L 23/00* (2006.01)
*H01L 25/18* (2006.01)
(Continued)

(52) U.S. Cl.
CPC ............ *H01L 24/32* (2013.01); *H01L 23/481* (2013.01); *H01L 24/09* (2013.01); *H01L 25/18* (2013.01);
(Continued)

(58) Field of Classification Search
CPC ........... H01L 21/76898; H01L 21/3043; H01L 21/568; H01L 21/4857; H01L 23/481;
(Continued)

(56) References Cited

U.S. PATENT DOCUMENTS 8,293,578 B2   10/2012   Bartley et al.
8,373,261 B2   2/2013   Kim et al.
(Continued)

OTHER PUBLICATIONS

Communication dated Apr. 26, 2022 issued by the Korean Intellectual Property Office in Korean Application No. 10-2018-0127571.
(Continued)

*Primary Examiner* — Nikolay K Yushin
(74) *Attorney, Agent, or Firm* — Sughrue Mion, PLLC

(57) ABSTRACT

A semiconductor package includes a first semiconductor chip including a first body portion, a first bonding layer including a first bonding insulating layer, a first redistribution portion including first redistribution layers, a first wiring insulating layer disposed between the first redistribution layers, and a second bonding layer including a second bonding insulating layer, a second redistribution portion including second redistribution layers, a second wiring insulating layer disposed between the second redistribution layers, and a second semiconductor chip disposed on the second redistribution portion. A lower surface of the first bonding insulating layer is bonded to an upper surface of the second bonding insulating layer, an upper surface of the first bonding insulating layer contacts the first body portion, a lower surface of the second bonding insulating layer contacts the second wiring insulating layer, and the first redistribution portion width is greater than the first semiconductor chip width.

20 Claims, 13 Drawing Sheets

(51) Int. Cl.
*H01L 23/48* (2006.01)
*H01L 21/00* (2006.01)

(52) U.S. Cl.
CPC ............ *H01L 2224/02331* (2013.01); *H01L 2224/085* (2013.01)

(58) Field of Classification Search
CPC ....... H01L 23/36; H01L 23/66; H01L 23/544; H01L 24/94; H01L 24/97; H01L 24/92; H01L 24/08; H01L 24/80; H01L 24/09; H01L 24/32; H01L 24/20; H01L 24/19; H01L 25/50; H01L 25/18; H01L 25/105; H01L 2224/05124; H01L 2224/73251; H01L 2224/08237; H01L 2224/80013; H01L 2224/05116; H01L 2224/80357; H01L 2224/05111; H01L 2224/05166; H01L 2224/05655; H01L 2224/05686; H01L 2224/131; H01L 2224/97; H01L 2224/05684; H01L 2224/06181; H01L 2224/05184; H01L 2224/73265; H01L 2224/05155; H01L 2224/08145; H01L 2224/13111; H01L 2224/05666; H01L 2224/085; H01L 2224/05611; H01L 2224/80895; H01L 2224/09181; H01L 2224/05644; H01L 2224/13124; H01L 2224/05639; H01L 2224/9202; H01L 2224/05009; H01L 2224/02331; H01L 2224/13139; H01L 2224/32225; H01L 2224/48227; H01L 2224/0401; H01L 2224/05139; H01L 2224/94; H01L 2224/13147; H01L 2225/107; H01L 2224/05616; H01L 2924/1816; H01L 2224/05647; H01L 2224/80896; H01L 2224/05144; H01L 2224/05147; H01L 2224/05624; H01L 2224/45099; H01L 2224/08146; H01L 2224/2919; H01L 2224/0346; H01L 2224/0557; H01L 2224/32245; H01L 2224/02372; H01L 2224/05548; H01L 2224/80006; H01L 2224/16237; H01L 2224/08; H01L 2224/32; H01L 2224/03; H01L 2224/80001; H01L 2225/1058; H01L 2225/0651; H01L 2225/06562
See application file for complete search history.

(56) References Cited

U.S. PATENT DOCUMENTS

| | | | |
|---|---|---|---|
| 9,524,959 | B1 | 12/2016 | Yeh et al. |
| 9,583,472 | B2 | 2/2017 | Chung et al. |
| 9,659,907 | B2 | 5/2017 | Zhai et al. |
| 9,768,145 | B2 | 9/2017 | Yu et al. |
| 10,026,704 | B2 | 7/2018 | Wu et al. |
| 10,026,716 | B2 | 7/2018 | Yu et al. |
| 10,535,632 | B2 | 1/2020 | Jeng et al. |
| 11,251,157 | B2 * | 2/2022 | Yang ...................... H01L 24/08 |
| 2004/0178508 | A1 | 9/2004 | Nishimura et al. |
| 2014/0183731 | A1 | 7/2014 | Lin et al. |
| 2015/0325497 | A1 | 11/2015 | Yu et al. |
| 2016/0093591 | A1 | 3/2016 | Lan et al. |
| 2017/0092626 | A1 | 3/2017 | Yuan et al. |
| 2017/0301650 | A1 | 10/2017 | Yu et al. |
| 2018/0068978 | A1 | 3/2018 | Jeng et al. |
| 2018/0294212 | A1 | 10/2018 | Chen et al. |
| 2019/0131277 | A1 * | 5/2019 | Yang ...................... H01L 24/05 |

OTHER PUBLICATIONS

Communication dated Oct. 28, 2022 by the Korean Intellectual Property Office in Korean Patent Application No. 10-2018-0127571.

\* cited by examiner

SEMICONDUCTOR PACKAGE

CROSS-REFERENCE TO RELATED APPLICATION(S)

This application is a continuation application of U.S. application Ser. No. 16/511,695, filed Jul. 15, 2019, which claims priority from Korean Patent Application No. 10-2018-0127571 filed on Oct. 24, 2018 in the Korean Intellectual Property Office, the entire contents of each of which are incorporated by reference herein in their entireties.

BACKGROUND

1. Field

Apparatuses and devices consistent with the present disclosure relate to a semiconductor package.

2. Description of Related Art

With the continuing development of the electronics industry, there is a growing demand for high-performance, high-speed and miniaturization of electronic components. According to this tendency, in the functional aspect, a system in package (SIP), for a system requiring complexity and versatility, has been studied. Moreover, in the structural aspect, a package in which a plurality of semiconductor chips are stacked and mounted on one package substrate or a package on package (PoP) structure in which a package is stacked above a package have been developed. In detail, in such semiconductor packages, various attempts have been made to reduce a thickness thereof.

SUMMARY

It is an aspect to provide a semiconductor package having a significantly reduced thickness and that provides increased reliability.

According to an aspect of an example embodiment, there is provided a semiconductor package including a first semiconductor chip including a body portion, a first bonding layer disposed on a first surface of the body portion, and through vias passing through at least a portion of the body portion; and a first redistribution portion disposed in a lower portion of the first semiconductor chip to be connected to the first semiconductor chip through the first bonding layer, the first redistribution portion including first redistribution layers electrically connected to the first semiconductor chip, at least one first wiring insulating layer disposed between the first redistribution layers, and a second bonding layer connected to the first bonding layer, wherein the first bonding layer and the second bonding layer include first metal pads and second metal pads disposed to correspond to each other and bonded to each other, respectively, and a first insulating layer and a second bonding insulating layer surrounding the first metal pads and the second metal pads, respectively.

According to an aspect of an example embodiment, there is provided a semiconductor package including a semiconductor chip including a first bonding layer disposed on a surface; and a redistribution portion disposed on the surface of the semiconductor chip and connected to the semiconductor chip through the first bonding layer, the redistribution portion including redistribution layers electrically connected to the semiconductor chip, at least one wiring insulating layer disposed between the redistribution layers, and a second bonding layer connected to the first bonding layer, wherein the first bonding layer and the second bonding layer include first metal pads and second metal pads, disposed to correspond to each other and bonded to each other, respectively, and a first insulating layer and a second bonding insulating layer, surrounding the first metal pads and the second metal pads, respectively, and the entirety of the redistribution layers are disposed to overlap the semiconductor chip on a plane.

According to an aspect of the present inventive concept, there is provided a semiconductor package comprising a first semiconductor chip including first metal pads disposed on a surface and through vias passing through at least a portion of the first semiconductor chip; a first redistribution portion disposed in a lower portion of the first semiconductor chip, and including second metal pads bonded to the first metal pads and a first redistribution layer electrically connected to the first semiconductor chip; a second redistribution portion disposed in an upper portion of the first semiconductor chip, and including a second redistribution layer electrically connected to the first semiconductor chip and third metal pads disposed on an upper surface of the second redistribution portion; and at least one second semiconductor chip disposed on the second redistribution portion, and in which fourth metal pads are disposed of a surface thereof, the fourth metal pads being bonded to the third metal pads.

According to another aspect of an example embodiment, there is provided a semiconductor package comprising a semiconductor chip including a first bonding layer disposed on a first surface of the semiconductor chip, the first bonding layer including first metal pads and a first insulating layer surrounding the first metal pads; and a first redistribution portion including one or more redistribution layers electrically connected to the semiconductor chip, and a second bonding layer including second metal pads and a second insulating layer surrounding the second metal pads, wherein the first bonding layer is hybrid bonded to the second bonding layer to connect the semiconductor chip to the first redistribution portion.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, the example embodiments of the present disclosure will be described in detail with reference to the attached drawings.

Figure 1:
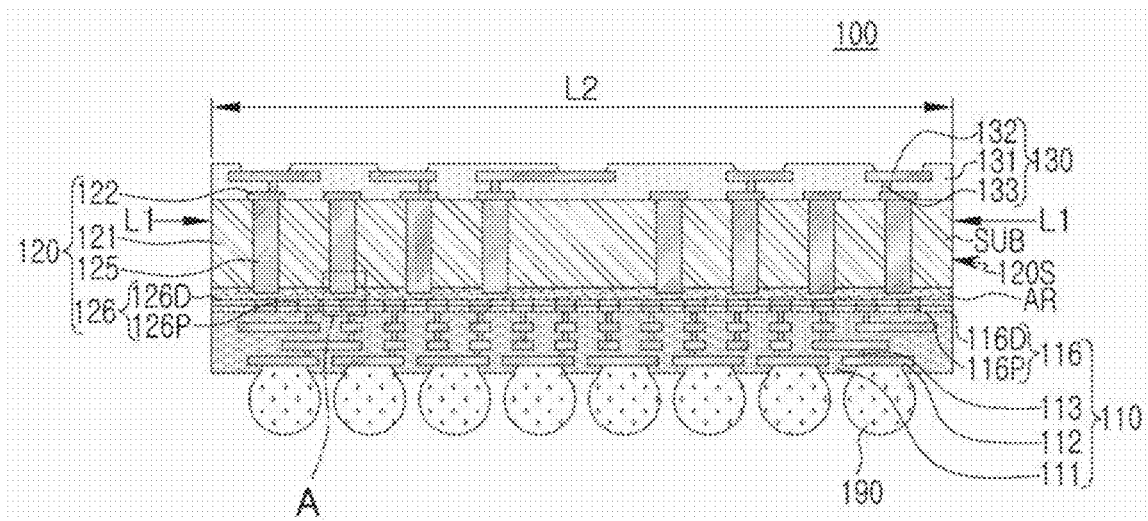
FIG. 1 is a schematic cross-sectional view illustrating a semiconductor package according to example embodiments.

FIG. 1 is a schematic cross-sectional view illustrating a semiconductor package according to example embodiments.

Figure 2:
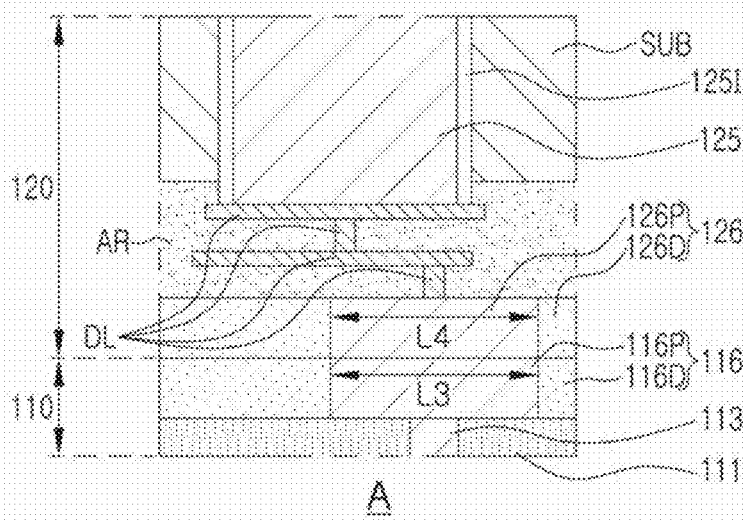
FIG. 2 is a partially enlarged view of a region A in the semiconductor package of FIG. 1, according to example embodiments.

FIG. 2 is a partially enlarged view illustrating a semiconductor package according to example embodiments. In FIG. 2, an 'A' region of FIG. 1 is enlarged and illustrated.

Referring to FIGS. 1 and 2, a semiconductor package 100 may include a semiconductor chip 120, a first redistribution portion 110 disposed in a lower portion of the semiconductor chip 120, a second redistribution portion 130 disposed in an upper portion of the semiconductor chip 120, and connection terminals 190 disposed in a lower portion of the first redistribution portion 110. The semiconductor package 100 may be a semiconductor package in a fan-in type, in which first metal pads 126P of the semiconductor chip 120 are redistributed in a lower region of the semiconductor chip 120.

The semiconductor chip 120 may include a body portion 121, wiring layers 122 on an upper surface of the semiconductor chip 120, through vias 125 passing through at least a portion of the body portion 121, and a first bonding layer 126. The semiconductor chip 120 may include a logic semiconductor chip and/or a memory semiconductor chip. The logic semiconductor chip may be a microprocessor, for example, a central processing unit (CPU), a controller, an application specific integrated circuit (ASIC), or the like. The memory semiconductor chip may be a volatile memory such as a dynamic random access memory (DRAM), a static random access memory (SRAM), or a non-volatile memory such as a flash memory.

The body portion 121 may include a substrate region SUB and an element region AR on a lower surface of the substrate region SUB. The substrate region SUB may be a region including a semiconductor material such as silicon (Si). The element region AR may be a region provided with elements, such as a transistor and/or memory cells, forming a semiconductor chip, based on the substrate region SUB. In the element region AR, as illustrated in FIG. 2, element layers DL forming the elements may be disposed. Thus, a lower surface of the semiconductor chip 120 may be an active surface, and an upper surface thereof may be an inactive surface. However, such an arrangement position of the active surface may be changed according to example embodiments.

The through vias 125 may pass through the substrate region SUB of at least the body portion 121, and may pass through at least a portion of the element region AR. The through vias 125 may provide electrical connection between the second redistribution portion 130 and the first redistribution portion 110. The through vias 125 may be electrically connected to the first metal pads 126P and the first redistribution portion 110 through the element layers DL. The through vias 125 may be electrically connected to the elements of the element region AR. The through vias 125 may be formed of a conductive material. For example, the through vias may include at least one among tungsten (W), aluminum (Al), and copper (Cu). As illustrated in FIG. 2, the through via 125 may be electrically separated from the substrate region SUB by a via insulating layer 125I having insulating properties. According to example embodiments, the through vias 125 may pass through the element region AR to be directly connected to the first metal pads 126P.

The wiring layers 122 may be disposed to be connected to the through vias 125 and the second redistribution portion 130 in an upper portion, on an upper surface of the semiconductor chip 120. The wiring layers 122 may be formed of a conductive material such as tungsten (W), aluminum (Al), and copper (Cu).

The first bonding layer 126 may include first metal pads 126P and a first bonding insulating layer 126D disposed to surround the first metal pads 126P. The first metal pads 126P may be electrically connected to elements of the element region AR and electrically connected to the through vias 125. The first bonding layer 126 may be a layer bonded to a second bonding layer 116 of the first redistribution portion 110 at a lower portion of the first bonding layer 126, and connecting the semiconductor chip 120 to the first redistribution portion 110.

The semiconductor chip 120 may have a first length L1 in one direction, and the first length may be substantially equal to a second length L2, a length of the entirety of the semiconductor package 100, as shown in FIG. 1. In other words, a size of the semiconductor package 100 may be determined by a size of the semiconductor chip 120. Here, a size of the semiconductor package 100 may be substantially the same as a size of the semiconductor chip 120 on a plane. Side surfaces 120S of the semiconductor chip 120 may form an outermost surface of the semiconductor package 100, and may be exposed externally of the semiconductor package 100.

The first redistribution portion 110 may redistribute the first metal pads 126P in a lower portion of the semiconductor chip 120. The first redistribution portion 110 may include a first wiring insulating layer 111, a plurality of first redistribution layers 112, a plurality of first vias 113, and the second bonding layer 116. The number of layers and the arrangement of the first wiring insulating layer 111, the first redistribution layers 112, and the first vias 113, forming the first redistribution portion 110, are not limited to those illustrated in the drawings, and may be variously changed according to example embodiments. The first redistribution portion 110 may be disposed to overlap the semiconductor chip 120 on a plane. In detail, at least first redistribution layers 112 and first vias 113 may be disposed to overlap the semiconductor chip 120 on a plane.

The first wiring insulating layer 111 may be formed of an insulating material, for example, a photoimageable dielectric (PID) resin. In this case, the first wiring insulating layer 111 may further include an inorganic filler. The first wiring insulating layer 111 may be provided to have a plurality of layers according to a number of layers of the first redistribution layers 112, and may be formed of the same material or different materials. The first redistribution layers 112 and the first vias 113 may serve to redistribute signals from the semiconductor chip 120. The first vias 113 may be completely filled with a conductive material, but are not limited thereto. In some example embodiments, the first vias 113 may have a form in which a conductive material is provided along a wall of a via hole, and may have various forms such as a tapered shape, a cylindrical shape, and the like. The first redistribution layers 112 and the first vias 113 may include a conductive material, for example, copper (Cu), aluminum (Al), silver (Ag), tin (Sn), gold (Au), nickel (Ni), lead (Pb), titanium (Ti), or alloys thereof.

The second bonding layer 116 may include second metal pads 116P and a second bonding insulating layer 116D disposed to surround the second metal pads 116P. The second metal pads 116P may be connected to each other by the first redistribution layers 112 and the first vias 113. The second bonding insulating layer 116D may be formed of a material different from that of the first wiring insulating layer 111. For example, the second bonding insulating layer 116D may be formed of a silicon oxide-based or silicon nitride-based material. The second bonding layer 116 may be a layer bonded to the first bonding layer 126 of the semiconductor chip 120 at an upper portion thereof, and connecting the semiconductor chip 120 to the first redistribution portion 110.

As illustrated in FIG. 2, in some example embodiments, the first bonding layer 126 and the second bonding layer 116 may be disposed in positions corresponding to each other and directly bonded to each other. The first metal pads 126P and the second metal pads 116P may include at least one among tungsten (W), aluminum (Al), copper (Cu), tungsten nitride (WN), tantalum nitride (TaN), and titanium nitride (TiN). For example, when the first metal pads 126P and the second metal pads 116P are formed of copper (Cu), the first metal pads 126P and the second metal pads 116P may be physically and electrically connected to each other by copper (Cu)-to-copper (Cu) bonding. A size L3 of the second metal pads 116P may be the same as or similar to a size L4 of the first metal pads 126P, but the example embodiments are not limited thereto.

The first bonding insulating layer 126D and the second bonding insulating layer 116D may be bonded together by dielectric-to-dielectric bonding. The first bonding insulating layer 126D and the second bonding insulating layer 116D may be formed of a material different from that of the first wiring insulating layer 111. For example, the first bonding insulating layer and the second bonding insulating layer may include at least one among SiO, SiN, SiCN, SiOC, SiON, and SiOCN.

Thus, the semiconductor chip 120 and the first redistribution portion 110 may be bonded by hybrid bonding, provided by the copper (Cu)-to-copper (Cu) bonding of the first metal pads 126P and the second metal pads 116P, and the dielectric-to-dielectric bonding of the first bonding insulating layer 126D and the second bonding insulating layer 116D. In this case, a bonding thickness is significantly reduced, and therefore a thickness of the semiconductor package 100 may be reduced, as compared with the case of connection by a bump. Moreover, when a thickness of the entirety of the semiconductor package 100 is maintained, a thickness of the semiconductor chip 120 may be relatively increased, which may be advantageous in terms of heat dissipation.

The connection terminals 190 may be disposed to be connected to the first redistribution layers 112, in a lower portion of the first redistribution portion 110. In some example embodiments, under-bump metal layers UBM may be further interposed between the connection terminals 190 and the first redistribution layers 112. The connection terminals 190 may connect the semiconductor package 100 to a mainboard of an electronic device on which the semiconductor package 100 is mounted. The connection terminals 190 may include a conductive material, for example, at least one among a solder, tin (Sn), silver (Ag), copper (Cu), and aluminum (Al). A shape of the connection terminals 190 may be changed into various shapes such as a land, a bump, a pillar, and a pin, in addition to a ball shape.

The second redistribution portion 130 may be disposed in an upper portion of the semiconductor chip 120, and may be electrically connected to the semiconductor chip 120 and/or the first redistribution portion 110. The second redistribution portion 130 may include a second wiring insulating layer 131, a plurality of second redistribution layers 132, and a plurality of second vias 133. The number of layers and arrangement, of the second wiring insulating layer 131, the second redistribution layers 132, and the second vias 133, forming the second redistribution portion 130, are not limited to those illustrated in the drawings, and may be variously changed according to example embodiments.

The second wiring insulating layer 131 may be formed of an insulating material, in a manner similar to the first wiring insulating layer 111, for example, a photoimageable dielectric (PID) resin. According to example embodiments, a layer, disposed in an uppermost portion, of the second wiring insulating layer 131, may be a passivation layer, and may be formed of a material different from that of a lower portion. The second redistribution layers 132 and the second vias 133 may include a conductive material, for example, copper (Cu), aluminum (Al), silver (Ag), tin (Sn), gold (Au), nickel (Ni), lead (Pb), titanium (Ti), or alloys thereof. In an uppermost portion, the second redistribution layers 132 may be exposed through the second wiring insulating layer 131, and may be electrically connected to a semiconductor device, disposed in an upper portion, through an exposed region.

Figure 3:
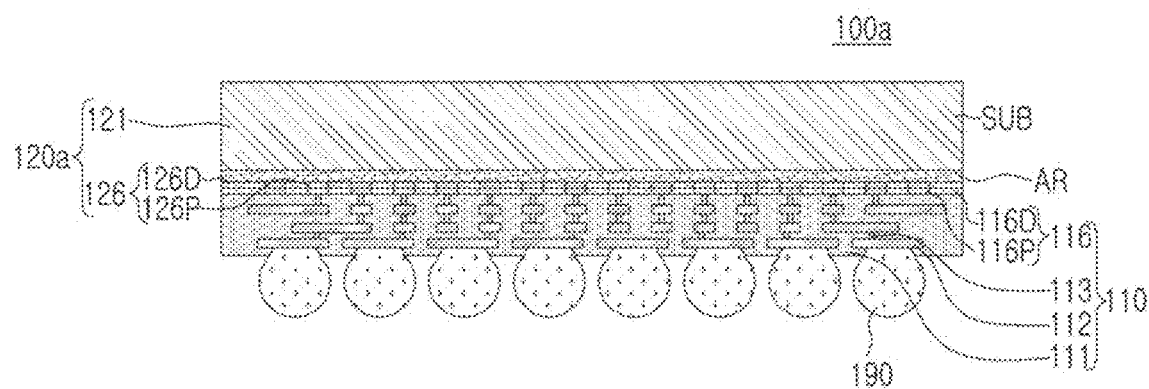
FIG. 3 is a schematic cross-sectional view illustrating a semiconductor package according to example embodiments.

FIG. 3 is a schematic cross-sectional view illustrating a semiconductor package according to example embodiments.

Referring to FIG. 3, a semiconductor package 100a may include a semiconductor chip 120a, a first redistribution portion 110 disposed in a lower portion of the semiconductor chip 120a, and connection terminals 190 disposed in a lower portion of the first redistribution portion 110. The semiconductor package 100a may be a semiconductor package in a fan-in type, in which first metal pads 126P of the semiconductor chip 120a are redistributed in a lower region of the semiconductor chip 120a.

In the semiconductor chip 120a, in a manner different from an example embodiment of FIG. 1, the second redistribution portion 130 is not disposed in an upper portion of the semiconductor chip 120a, and thus, through vias 125 are not included therein. Even in this case, the first redistribution portion 110 and the semiconductor chip 120a are hybrid bonded by the first bonding layer 126 and the second bonding layer 116, thereby significantly reducing a thickness of the semiconductor package 100a.

Figure 4:
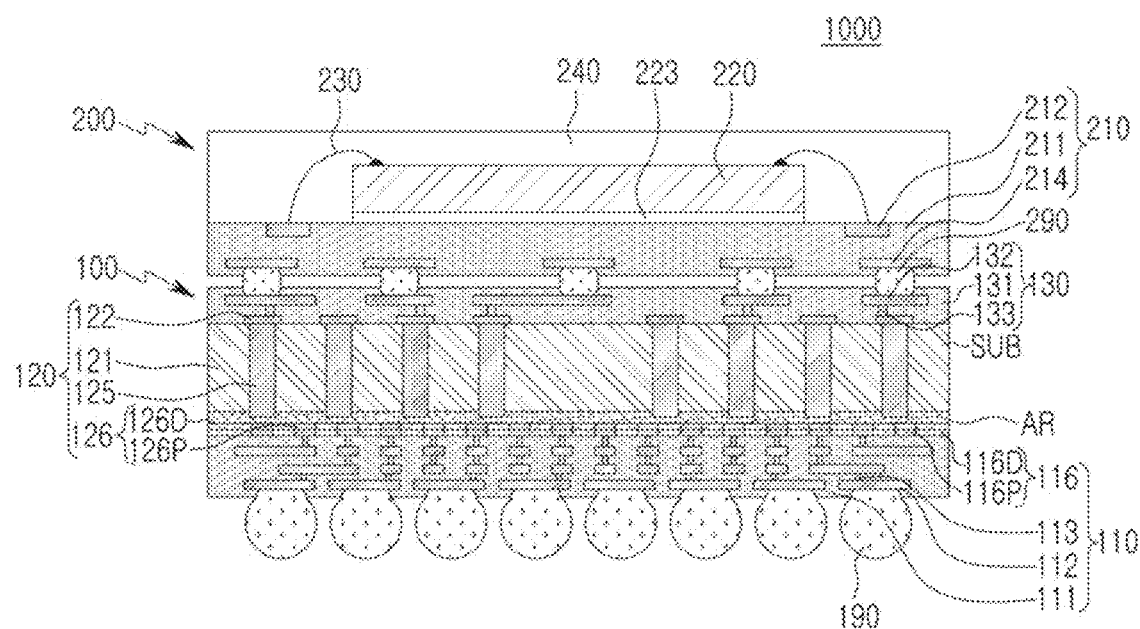
FIG. 4 is a schematic cross-sectional view illustrating a semiconductor package according to example embodiments.

FIG. 4 is a schematic cross-sectional view illustrating a semiconductor package according to example embodiments.

Referring to FIG. 4, a semiconductor package 1000 may include a first semiconductor package 100 and a second semiconductor package 200. The semiconductor package 1000 may be a semiconductor package in a package-on-package (POP) type in which a second semiconductor package 200 is stacked on a first semiconductor package 100. Moreover, the semiconductor package 1000 may be a semiconductor package in a fan-in type, in which pads of the semiconductor chip 120 of the first semiconductor package 100 are redistributed in a lower region of the semiconductor chip 120.

The first semiconductor package 100 may include a semiconductor chip 120, a first redistribution portion 110 disposed in a lower portion of the semiconductor chip 120, a second redistribution portion 130 disposed in an upper portion of the semiconductor chip 120, and connection terminals 190 disposed in a lower portion of the first redistribution portion 110. Thus, the description of FIG. 1 may be applied to the first semiconductor package 100 as well and repeated description thereof will be omitted for conciseness.

The second semiconductor package 200 may include a wiring board 210, an upper semiconductor chip 220, an electrical connection portion 230, an encapsulation portion 240, and upper connection terminals 290.

The wiring board 210 may include a body portion 211, upper pads 212 exposed through an upper surface of the body portion 211, and lower pads 214 exposed through a lower surface of the body portion 211. The wiring board 210 may include, for example, silicon (Si), glass, ceramic, or plastic. The wiring board 210 may be an interposer substrate, and may have a single layer or a multi-layer structure including wiring patterns therein.

The upper semiconductor chip 220 may include a logic semiconductor chip and/or a memory semiconductor chip. For example, the semiconductor chip 120 of the first semiconductor package 100 may be an application processor (AP), while the upper semiconductor chip 220 may be a memory chip. The upper semiconductor chip 220 may include a plurality of semiconductor chips stacked on each other or disposed in parallel. An upper surface of the upper semiconductor chip 220 may be an active surface, but is not limited thereto. For example, a lower surface of the upper semiconductor chip 220 may be an active surface, and the upper semiconductor chip may be mounted in a flip-chip type on the wiring board 210.

The electrical connection portion 230 may electrically connect the upper semiconductor chip 220 to the upper pads 212 of the wiring board 210. The electrical connection portion 230 may include a wire. However, a specific form of the electrical connection portion 230 is not limited thereto, and may include various types of signal transmission medium. An adhesive layer 223 may serve to attach the upper semiconductor chip 220 to the wiring board 210.

The encapsulation portion 240 may be disposed to surround the upper semiconductor chip 220, and may serve to protect the upper semiconductor chip 220. The encapsulation portion 240 may be formed of, for example, a silicone-based material, a thermosetting material, a thermoplastic material, and an UV-treated material. The encapsulation portion 240 may be formed of a polymer such as a resin, for example, an epoxy molding compound (EMC).

The upper connection terminals 290 may be disposed on a lower surface of the wiring board 210. The upper connection terminals 290 may connect the second semiconductor package 200 to the wiring board 210, thereby electrically connecting the first semiconductor package 100 to the second semiconductor package 200. The upper connection terminals 290 may include a conductive material, for example, at least one among a solder, tin (Sn), silver (Ag), copper (Cu), and aluminum (Al).

While the semiconductor package 1000 is a semiconductor package in a POP type, the first redistribution portion 110 and the semiconductor chip 120 are hybrid bonded by the first bonding layer 126 and the second bonding layer 116 in the first semiconductor package 100 in a lower portion of the first semiconductor package 100. Thus, a thickness of the entirety of the semiconductor package 1000 may be reduced.

Figure 5:
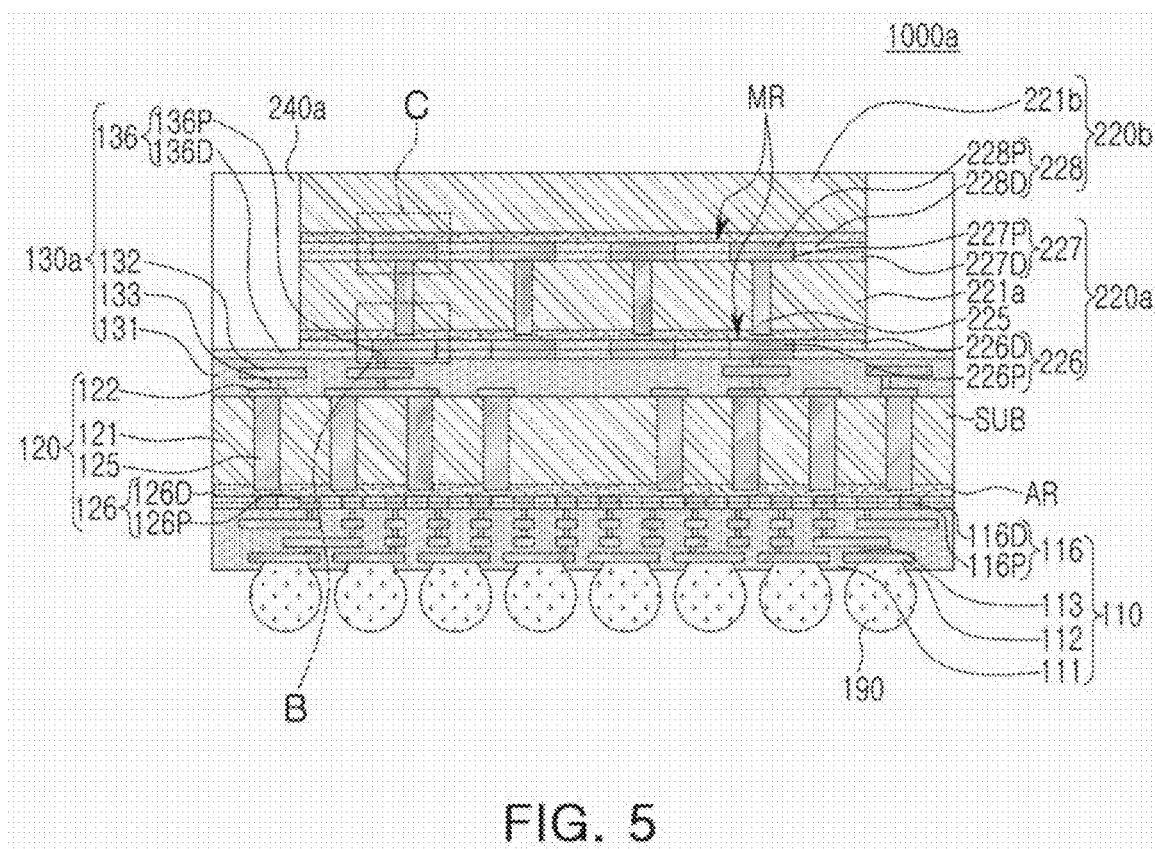
FIG. 5 is a schematic cross-sectional view illustrating a semiconductor package according to example embodiments.
Figure 6A:
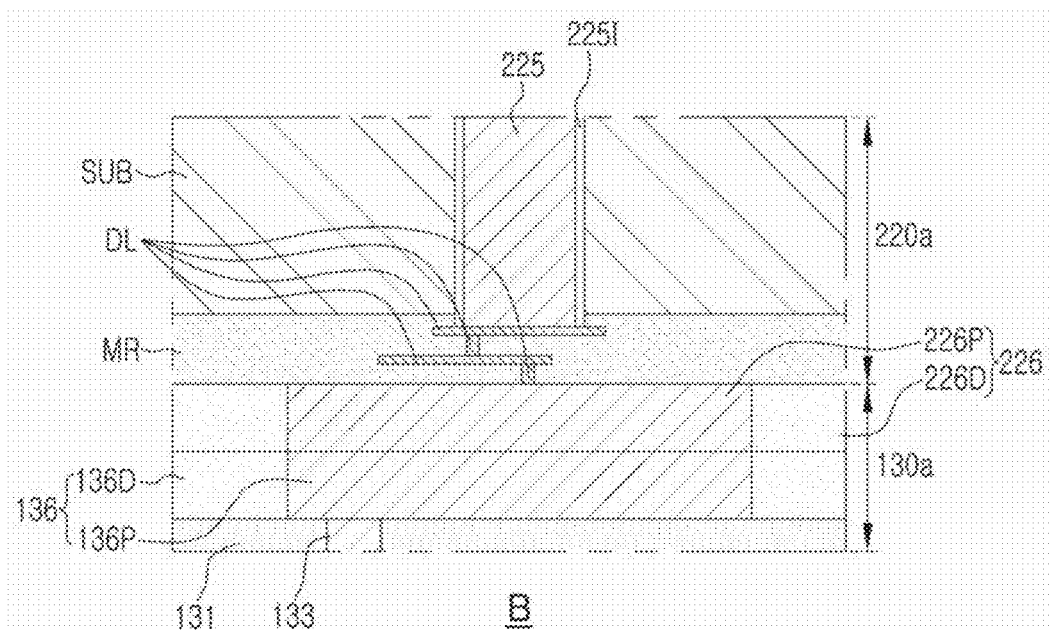
FIGS. 6A and 6B are partially enlarged views of regions B and C, respectively, of the semiconductor package of FIG. 5, according to example embodiments.
Figure 6B:
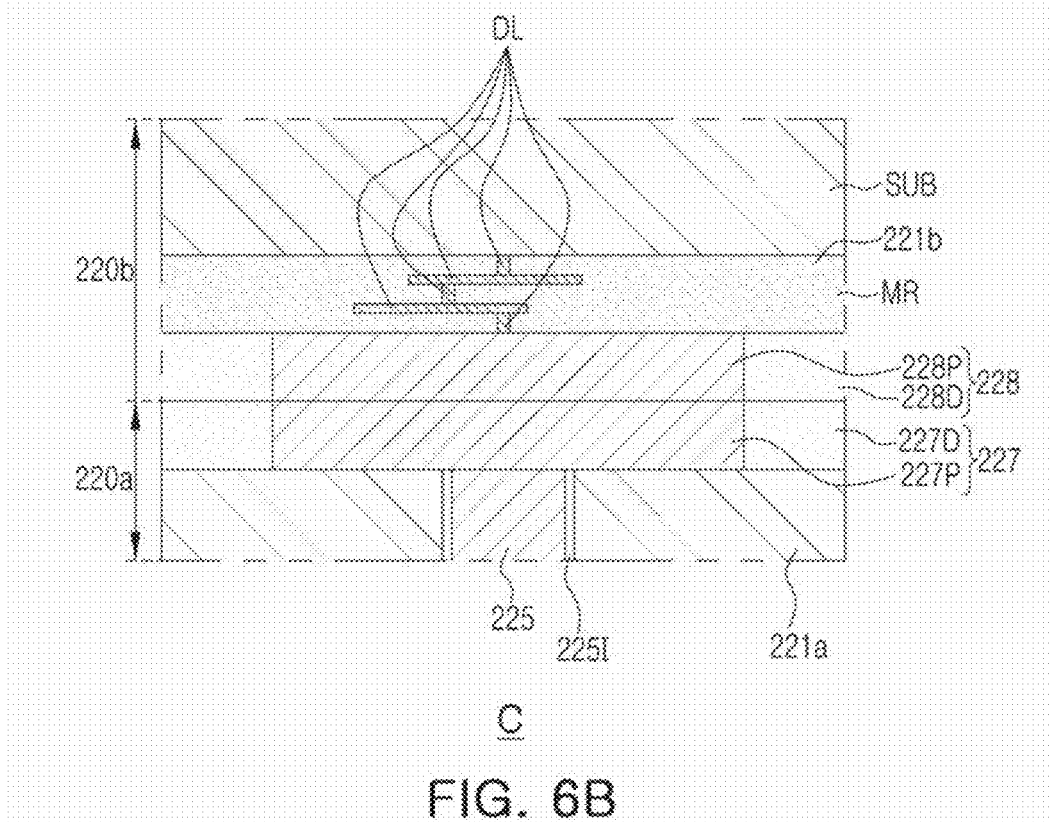

FIG. 5 is a schematic cross-sectional view illustrating a semiconductor package according to example embodiments. FIGS. 6A and 6B are partially enlarged views illustrating a semiconductor package according to example embodiments. In FIGS. 6A and 6B, 'B' region and 'C' region of FIG. 5 are enlarged and illustrated.

Referring to FIGS. 5 to 6B, a semiconductor package 1000a may include a semiconductor chip 120, a first redistribution portion 110 disposed in a lower portion of the semiconductor chip 120, a second redistribution portion 130a disposed in an upper portion of the semiconductor chip 120, a first upper semiconductor chip 220a and a second upper semiconductor chip 220b, sequentially stacked on the second redistribution portion 130a, an encapsulation portion 240a encapsulating the first upper semiconductor chip 220a and the second upper semiconductor chip 220b, and connection terminals 190 disposed in a lower portion of the first redistribution portion 110. The semiconductor package 1000a may be a semiconductor package in a fan-in type, in which the first metal pads 126P of the semiconductor chip 120 are redistributed in a lower region of the semiconductor chip 120. In FIGS. 5 to 6B, the same reference numerals as those in FIG. 1 denote the same components, and the description above with reference to FIG. 1 may be equally applied.

The semiconductor chip 120 may include the body portion 121, the wiring layers 122 on an upper surface of the body portion 121, the through vias 125 passing through at least a portion of the body portion 121, and the first bonding layer 126. The first redistribution portion 110 may include the first wiring insulating layer 111, the plurality of first redistribution layers 112, the plurality of first vias 113, and the second bonding layer 116.

The second redistribution portion 130a may include a second wiring insulating layer 131, a plurality of second redistribution layers 132, a plurality of second vias 133, and a third bonding layer 136 forming an upper surface. In a manner different from an example embodiment of FIG. 1, the second redistribution portion 130a may include second redistribution layers 132 forming a plurality of layers, and may further include a third bonding layer 136 for bonding with the first upper semiconductor chip 220a. The number of layers and arrangement, of the second wiring insulating layer 131, the second redistribution layers 132, and the second vias 133, forming the second redistribution portion 130a, are not limited to those illustrated in the drawings, and may be variously changed according to example embodiments.

The third bonding layer 136 may include third metal pads 136P and a third bonding insulating layer 136D disposed to surround the third metal pads 136P. The third metal pads 136P may be connected to each other by the second redistribution layers 132 and the second vias 133. The third bonding layer 136 may be a layer hybrid bonded to the fourth bonding layer 226 of the first upper semiconductor chip 220a, and connecting the first upper semiconductor chip 220a to the semiconductor chip 120 and the first redistribution portion 110 and the second redistribution portion 130a.

The first upper semiconductor chip 220a and the second upper semiconductor chip 220b may include a logic semiconductor chip and/or a memory semiconductor chip. For example, the semiconductor chip 120 in a lower portion is an AP chip, and the first upper semiconductor chip 220a and the second upper semiconductor chip 220b may be memory chips. For the first upper semiconductor chip 220a and the second upper semiconductor chip 220b, it is described that two are vertically stacked, by way of example. However, according to example embodiments, three or more are stacked, or at least a portion may be disposed in parallel.

The first upper semiconductor chip 220a may include a first upper body portion 221a, upper through vias 225 passing through at least a portion of the first upper body portion 221a, and a fourth bonding layer 226 and a fifth bonding layer 227. The second upper semiconductor chip 220b may include a second upper body portion 221b and a sixth bonding layer 228.

Each of the first upper body portion 221a and the second upper body portion 221b may include a substrate region SUB and an upper element region MR on a lower surface of the substrate region SUB. The substrate region SUB may be a region including a semiconductor material such as silicon (Si). The upper element region MR may be a region provided with elements, such as a transistor and/or memory cells forming a semiconductor chip, based on the substrate region SUB. In the upper element region MR, as illustrated in FIGS. 6A and 6B, element layers DL, forming the elements, may be disposed. Thus, a lower surface of the each of the first upper semiconductor chip 220a and the second upper semiconductor chip 220b may be an active surface, but the example embodiments are not limited thereto. For example, an upper surface of the first upper semiconductor chip 220a may be disposed to be an active surface, and a lower surface of the second upper semiconductor chip 220b may be disposed to be an active surface.

The upper through vias 225 may pass through the substrate region SUB of at least the first upper body portion 221a, and may pass through at least a portion of the upper element region MR. The upper through vias 225 may provide electrical connection between the second redistribution portion 130a and the second upper semiconductor chip 220b. The through vias 125 may also be electrically connected to the elements of the upper element region MR of the first upper semiconductor chip 220a. The upper through vias 225 may be formed of a conductive material. For example, the upper through vias may include at least one among tungsten (W), aluminum (Al), and copper (Cu). As illustrated in FIGS. 6A and 6B, the upper through vias 225 may be electrically separated from the substrate region SUB by the upper via insulating layer 225I having insulating properties.

The fourth to sixth bonding layers 226, 227, and 228 may include fourth to sixth metal pads 226P, 227P, and 228P, respectively, as well as fourth to sixth bonding insulating layers 226D, 227D, and 228D, respectively, disposed to surround the fourth to sixth metal pads 226P, 227P, and 228P, respectively.

The fourth bonding layer 226 may be a layer bonded to the third bonding layer 136 of the second redistribution portion 130a in a lower portion, and connecting the first upper semiconductor chip 220a to the second redistribution portion 130a. The fourth metal pads 226P may be electrically connected to the third metal pads 136P, and may be electrically connected to elements of the upper element region MR of the first upper semiconductor chip 220a and the upper through vias 225.

The fifth bonding layer 227 and the sixth bonding layer 228 may be bonded to each other and may be provided as a layer connecting the second upper semiconductor chip 220b to a structure in a lower portion thereof, including the first upper semiconductor chip 220a. The fifth metal pads 227P may form an upper surface of the first upper semiconductor chip 220a, and may be electrically connected to the upper through vias 225. The sixth metal pads 228P may be electrically connected to the elements of the upper element region MR of the second upper semiconductor chip 220b.

As illustrated in FIGS. 6A and 6B, the third metal pads 136P and the fourth metal pads 226P may be disposed in positions corresponding to each other and directly bonded to each other, while the fifth metal pads 227P and the sixth metal pads 228P may be disposed in positions corresponding to each other and directly bonded to each other. The third to sixth metal pads 136P, 226P, 227P, and 228P may include at least one among tungsten (W), aluminum (Al), copper (Cu), tungsten nitride (WN), tantalum nitride (TaN), and titanium nitride (TiN). For example, when the third to sixth metal pads are formed of copper (Cu), the third to sixth metal pads may be physically and electrically connected by copper (Cu)-to-copper (Cu) bonding. Sizes of the third to sixth metal pads 136P, 226P, 227P, and 228P, connected to each other, may be the same as or similar to each other, but are not limited thereto.

The third bonding insulating layer 136D and the fourth bonding insulating layer 226D, as well as the fifth bonding insulating layer 227D and the sixth bonding insulating layer 228D may be bonded by dielectric-to-dielectric bonding, respectively. The third to sixth bonding insulating layers 136D, 226D, 227D, and 228D may include an insulating material, for example, at least one among SiO, SiN, SiCN, SiOC, SiON, and SiOCN. In detail, the third bonding insulating layer 136D may be formed of a material different from that of the second wiring insulating layer 131.

In the semiconductor package 1000a, the semiconductor chip 120 and the first redistribution portion 110, the second redistribution portion 130a and the first upper semiconductor chip 220a, as well as the first upper semiconductor chip 220a and the second upper semiconductor chip 220b may be bonded by hybrid bonding, respectively. In this case, a bonding thickness is significantly reduced, so a thickness of the semiconductor package 1000a may be reduced, as compared with the case of connection by a bump. In other words, the semiconductor package 1000a may have a structure in which the first upper semiconductor chip 220a and the second upper semiconductor chip 220b, which are a memory chip, are stacked on the semiconductor chip 120, an AP chip, by way of example, while having a significantly reduced thickness. Thus, in the semiconductor package 1000a, a margin, allowing a thickness of each of the semiconductor chip 120 as well as the first upper semiconductor chip 220a and the second upper semiconductor chip 220b to be relatively increased, is provided, which may be advantageous in terms of heat dissipation.

The encapsulation portion 240a may be disposed to surround the first upper semiconductor chip 220a and the second upper semiconductor chip 220b, and thus may serve to protect the first upper semiconductor chip 220a and the second upper semiconductor chip 220b. However, in some example embodiments, the encapsulation portion 240a may be omitted. The encapsulation portion 240a may be formed of, for example, a silicone-based material, a thermosetting material, a thermoplastic material, and an UV-treated material. The encapsulation portion 240a may be formed of a polymer such as a resin, for example, an epoxy molding compound (EMC).

Figure 7:
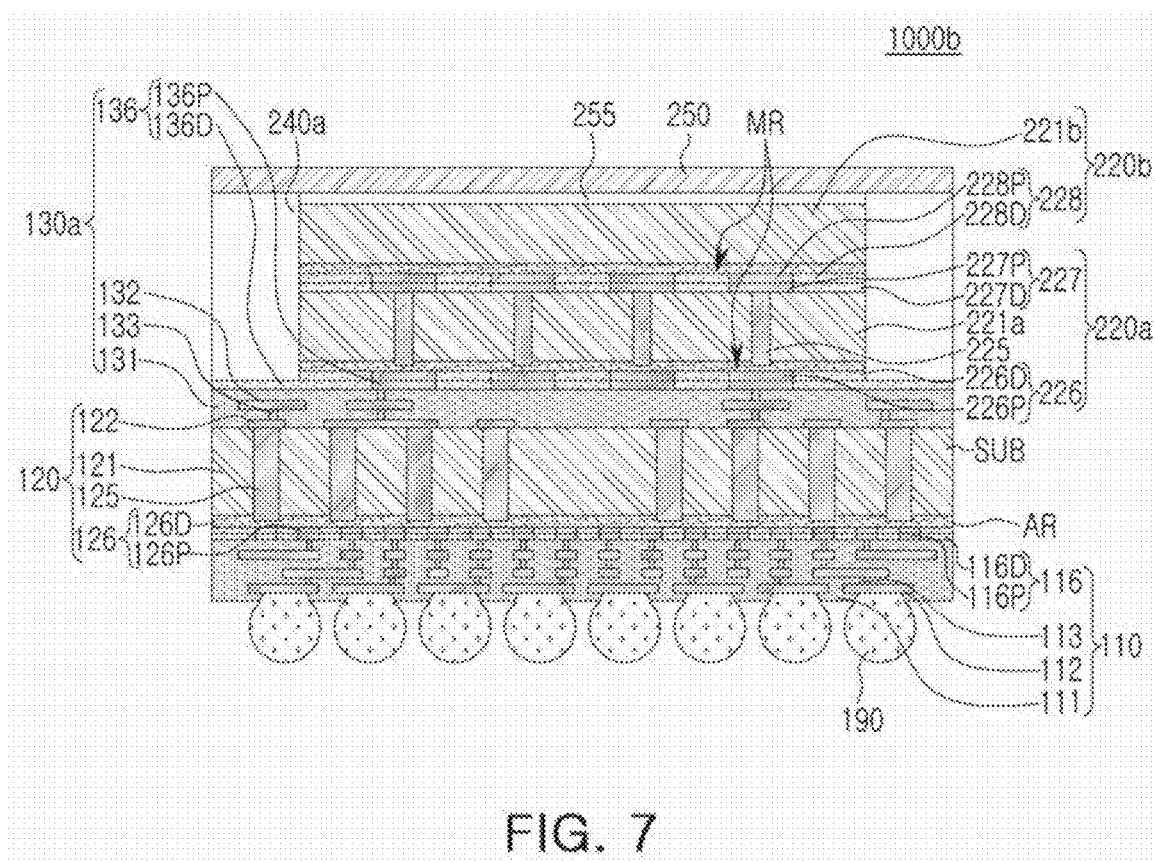
FIG. 7 is a schematic cross-sectional view illustrating a semiconductor package according to example embodiments.

FIG. 7 is a schematic cross-sectional view illustrating a semiconductor package according to example embodiments.

Referring to FIG. 7, the semiconductor package 1000b, in a manner different from an example embodiment of FIG. 5, may further include a heat dissipation layer 250 and an adhesive layer 255.

The heat dissipation layer 250 may be disposed on an upper surface of the second upper semiconductor chip 220b. The heat dissipation layer 250 may be stacked on the second upper semiconductor chip 220b by the medium of the adhesive layer 255. The heat dissipation layer 250 may be formed of a material with thermal conductivity higher than that of the first upper semiconductor chip 220a and the second upper semiconductor chip 220b, thereby dissipating heat generated from the first upper semiconductor chip 220a and the second upper semiconductor chip 220b upwardly. The heat dissipation layer 250 may be a metal layer formed of a metal, for example, copper (Cu).

The heat dissipation layer 250 may have a size, greater than those of the first upper semiconductor chip 220a and the second upper semiconductor chip 220b. For example, the heat dissipation layer 250 may have a size substantially the same as a size of the semiconductor package 1000b on a plane, and a side surface of the heat dissipation layer 250 may be coplanar with a side surface of the semiconductor chip 120. However, a size of the heat dissipation layer 250 is not limited thereto, and may have a size the same as those of the first upper semiconductor chip 220a and the second upper semiconductor chip 220b, according to example embodiments.

Figure 8:
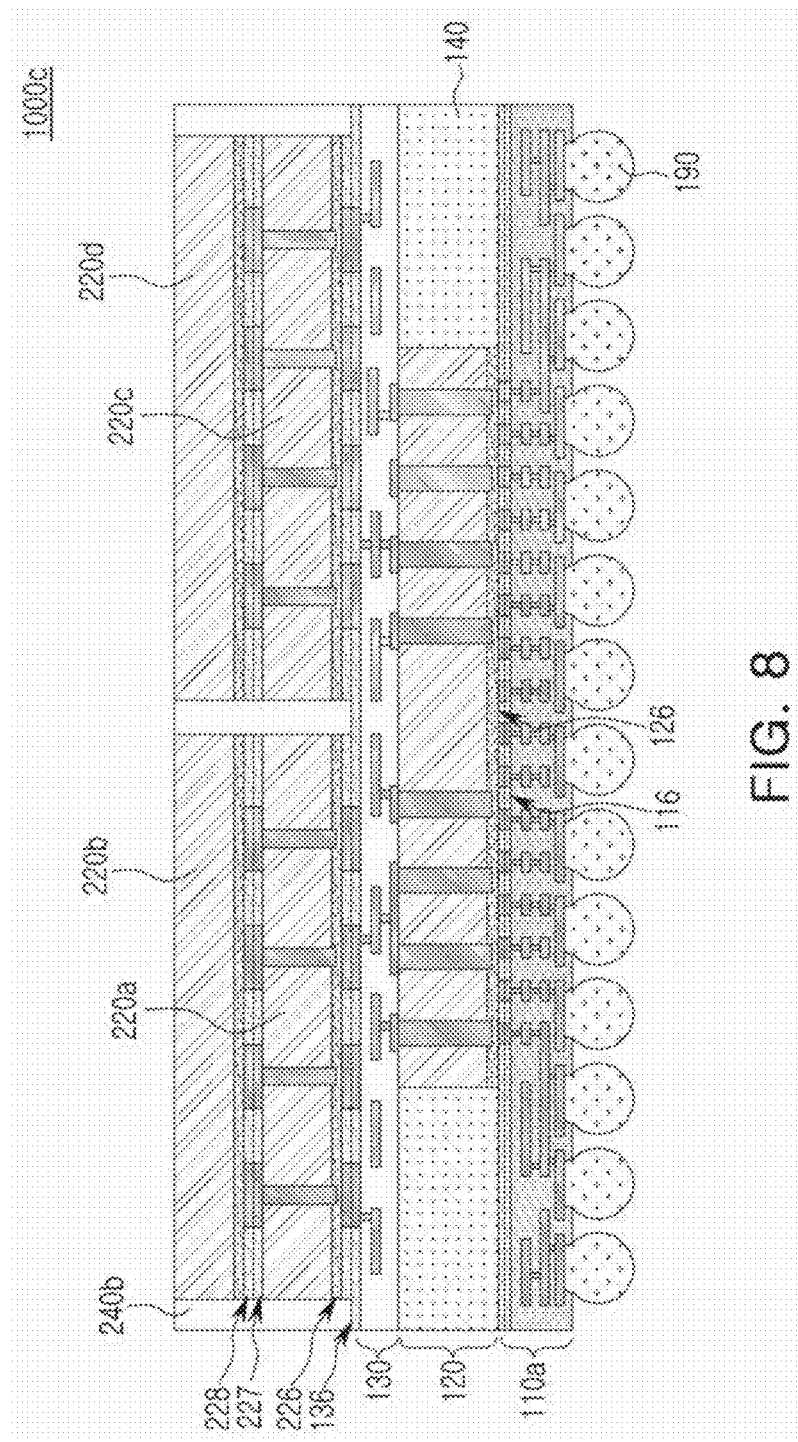
FIG. 8 is a schematic cross-sectional view illustrating a semiconductor package according to example embodiments.

FIG. 8 is a schematic cross-sectional view illustrating a semiconductor package according to example embodiments.

Referring to FIG. 8, a semiconductor package 1000c may include a semiconductor chip 120, a first redistribution portion 110a disposed in a lower portion of the semiconductor chip 120, a second redistribution portion 130a disposed in an upper portion of the semiconductor chip 120, a lower encapsulation portion 140 encapsulating the semiconductor chip 120, first to fourth upper semiconductor chips 220a, 220b, 220c, and 220d stacked on the second redistribution portion 130a, an upper encapsulation portion 240b encapsulating the first to fourth upper semiconductor chips 220a, 220b, 220c, and 220d, and connection terminals 190 disposed in a lower portion of the first redistribution portion 110a. The semiconductor package 1000c may be a semiconductor package in a fan-out type, in which the first metal pads 126P of the semiconductor chip 120 are extended to an outer region of the semiconductor chip 120 and redistributed. Thus, the first redistribution portion 110a may include a region not overlapped with the semiconductor chip 120 on a plane.

The semiconductor package 1000c, in a manner different from an example embodiment of FIG. 5, the first redistribution portion 110a is not limited to a region below the semiconductor chip 120, but may be disposed to be extended to an outer region of the semiconductor chip 120. Thus, a lower encapsulation portion 140 encapsulating the semiconductor chip 120 may be further disposed between the first redistribution portion 110a and the second redistribution portion 130a. Moreover, four first to fourth upper semiconductor chips 220a, 220b, 220c, and 220d may be disposed while two upper semiconductor chips are stacked on each other.

The lower encapsulation portion 140 may be formed of, for example, a silicone-based material, a thermosetting material, a thermoplastic material, and an UV-treated material. The lower encapsulation portion 140 may be formed of a polymer such as a resin, for example, an epoxy molding compound (EMC). According to example embodiments, a via passing through the lower encapsulation portion 140 and connecting the first redistribution portion 110a to the second redistribution portion 130a may be further disposed in the lower encapsulation portion 140.

The third upper semiconductor chip 220c and the fourth upper semiconductor chip 220d may include bonding layers, in a manner similar to the first upper semiconductor chip 220a and the second upper semiconductor chip 220b. Thus, the third upper semiconductor chip 220c may be bonded to the second redistribution portion 130a by hybrid bonding, and the fourth upper semiconductor chip 220d may be bonded the third upper semiconductor chip 220c by hybrid bonding.

Figure 9:
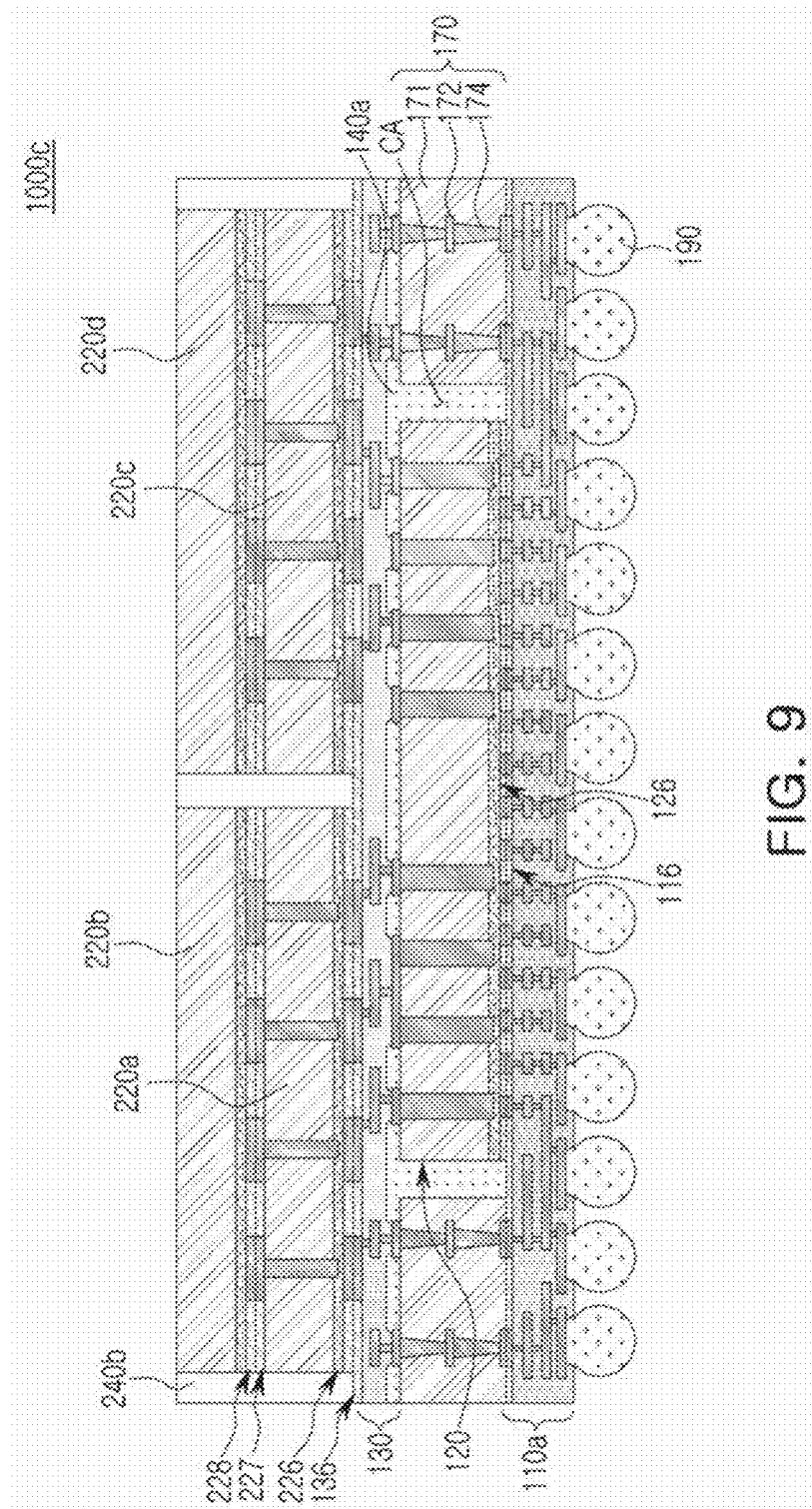
FIG. 9 is a schematic cross-sectional view illustrating a semiconductor package according to example embodiments.

FIG. 9 is a schematic cross-sectional view illustrating a semiconductor package according to example embodiments.

Referring to FIG. 9, the semiconductor package 1000d, in a manner different from an example embodiment of FIG. 8, may further include a core layer 170 surrounding the semiconductor chip 120.

The core layer 170 may include a through-hole CA passing through an upper surface and a lower surface to mount the semiconductor chip 120. The through-hole CA may be formed at the center of the core layer 170, but the number and arrangement of the through-hole CA are not limited to those illustrated in the drawings. Moreover, in some example embodiments, the through-hole CA may have a cavity shape without completely passing through a lower surface. The core layer 170 may be hybrid bonded to the first redistribution portion 110a in a manner similar to the semiconductor chip 120, but is not limited thereto.

The core layer 170 may include a core insulating layer 171, core wiring layers 172, and core vias 174. The core wiring layers 172 and the core vias 174 may be disposed to electrically connect an upper surface to a lower surface of the core layer 170. The core wiring layers 172 may be connected to the first redistribution layer 112 and the second redistribution layer 132 of the first redistribution portion 110 and the second redistribution portion 130a. The core wiring layers 172 may be disposed in the core insulating layer 171, but are not limited thereto. Core wiring layers 172, exposed through a lower surface of the core layer 170, among the core wiring layers 172, may be disposed to be embedded in the core insulating layer 171, which may be a structure according to a manufacturing process. According to example embodiments, the core layer 170 may not include core wiring layers 172 and core vias 174, but include a core insulating layer 171.

The core insulating layer 171 may include an insulating material, for example, a thermosetting resin such as an epoxy resin or a thermoplastic resin such as polyimide, and may further include an inorganic filler. Alternatively, the core insulating layer 171 may include a resin impregnated in a core material such as a glass fiber, a glass cloth, a glass fabric, or the like, together with an inorganic filler, for example, a prepreg, an Ajinomoto build-up film (ABF), FR-4, or Bismaleimide Triazine (BT). The core wiring layers 172 and the core vias 174 may include a metal material such as copper (Cu), or the like.

The lower encapsulation portion 140a may fill a space in the through-hole CA of the core layer 170 to encapsulate the through-hole CA, and may be extended to an upper surface of the core layer 170. The lower encapsulation portion 140a may fill at least a portion of a space between inner side walls of the semiconductor chip 120 and the through-hole CA. Thus, the lower encapsulation portion 140a may serve as an adhesive layer.

FIGS. 10A to 10F are views schematically illustrating a method of manufacturing a semiconductor package according to example embodiments for respective main operations. In FIGS. 10A to 10F, an exemplary method of manufacturing a semiconductor package of FIG. 5 is illustrated.

Figure 10A:
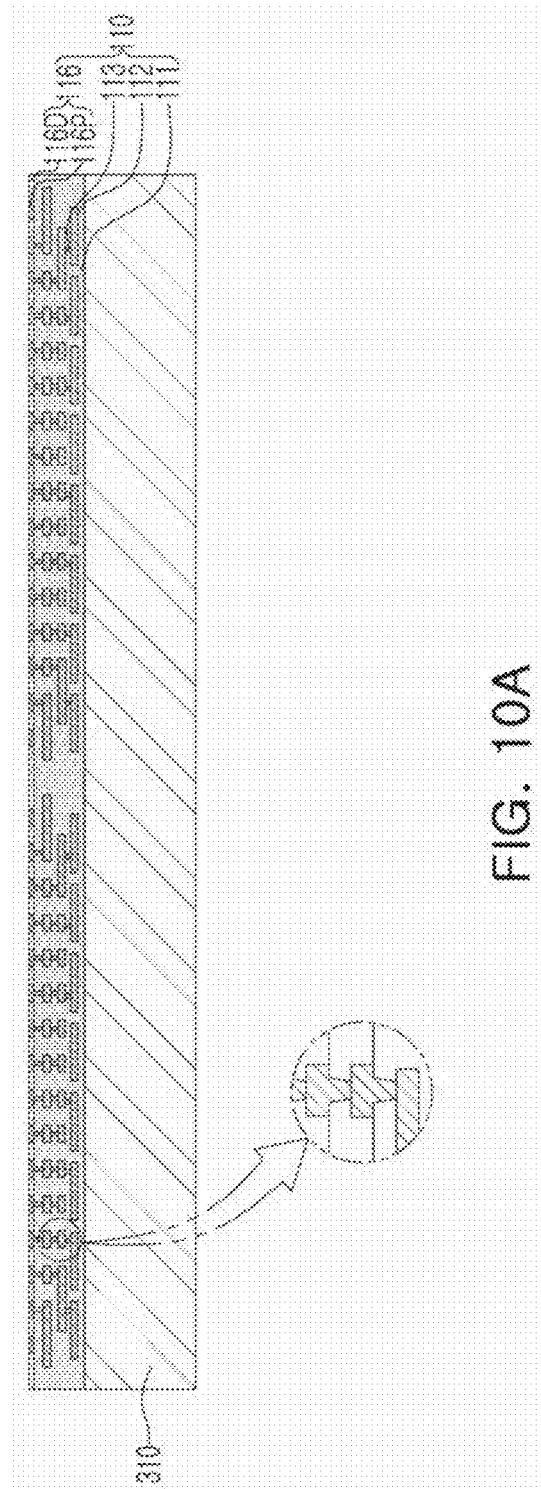
FIGS. 10A to 10F are views schematically illustrating respective operations of a method of manufacturing a semiconductor package according to example embodiments.

Referring to FIG. 10A, a first redistribution portion 110 may be formed on a carrier substrate 310.

The carrier substrate 310 may be a temporary substrate for supporting the semiconductor package, during a manufacturing process. The carrier substrate 310 may be, for example, a glass substrate, but is not limited thereto.

A process for forming a first wiring insulating layer 111 to a predetermined thickness, a process for forming a via hole passing through a portion of the first wiring insulating layer 111, and a process for forming first vias 113 and first redistribution layers 112 on the first vias 113 by filling the via hole using a plating process, are repeatedly performed. Thus, a portion of a first redistribution portion 110 may be manufactured. In the operation described above, the first redistribution layers 112 and the first vias 113 may be formed while being sequentially stacked from a bottom. Thus, as illustrated in an enlarged view, the first vias 113 may have a taper shape in which a width of an upper surface is wider than a width of a lower surface.

Then, a second bonding insulating layer 116D, having been patterned, is formed in an uppermost portion of the first redistribution portion 110, and second metal pads 116P may be formed using a plating process in a patterned region. The second bonding layer 116 may have a form in which the second bonding insulating layer 116D is protruding upwardly as compared with the second metal pads 116P, but is not limited thereto.

Figure 10B:
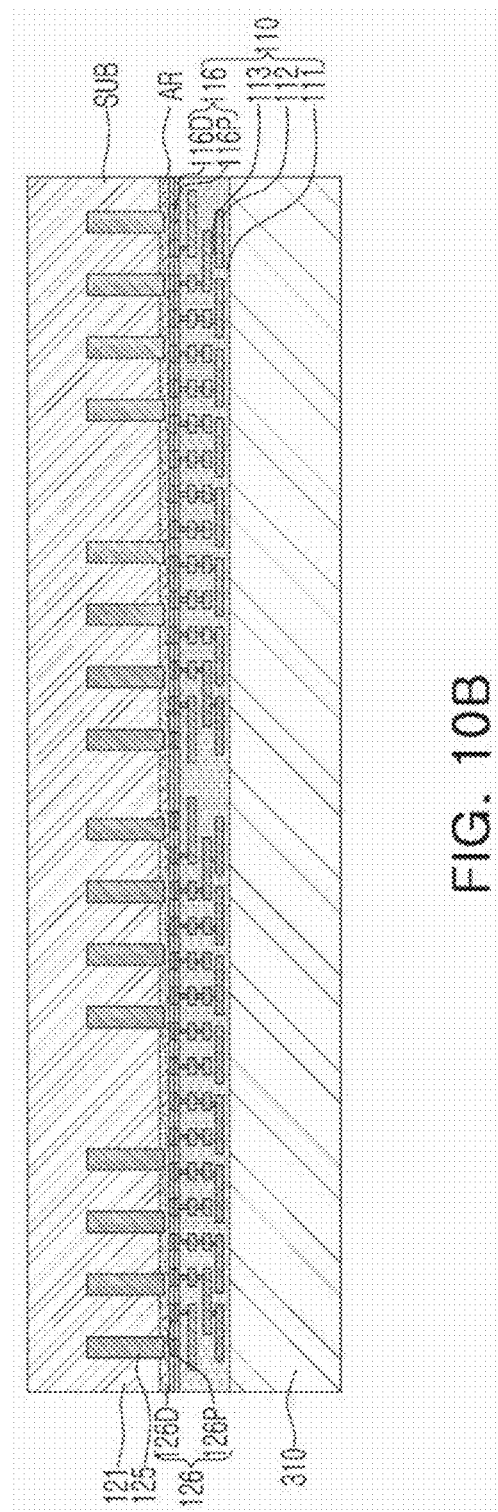

Referring to FIG. 10B, the semiconductor chip 120 may be bonded to the first redistribution portion 110.

The semiconductor chip 120 may be provided by forming an element region AR on a substrate region SUB of a body portion 121, and forming through vias 125 passing through a portion of the substrate region SUB from the element region AR. For example, the through vias 125 may be formed to have a via-middle structure. However, a structure of the through vias 125 is not limited thereto, and may be a via-first or via-last structure. For reference, a via-first structure denotes a structure in which a through via is formed first before an element region AR is formed in a body portion 121, a via-middle structure denotes a structure in which a through via is formed after a circuit such as a transistor of an element region AR is formed before wirings are formed thereabove, and a via-last structure denotes a structure in which a through via is formed after the wirings are formed. Moreover, the semiconductor chip 120 may be prepared by forming a first bonding layer 126 including first metal pads 126P and a first bonding insulating layer 126D, on an active surface.

The semiconductor chip 120 may be bonded to the first redistribution portion 110 by hybrid bonding the first bonding layer 126 to the second bonding layer 116. The first redistribution portion 110 and the semiconductor chip 120 may be directly bonded without intervention of an adhesive such as a separate adhesive layer. For example, coupling of the first redistribution portion 110 and the semiconductor chip 120 at an atomic level may be formed by a pressing process. According to example embodiments, before bonding, in order to enhance a bonding force, a surface treatment process such as a hydrogen plasma treatment may be further performed on bonding surfaces of the first bonding layer 126 and the second bonding layer 116. The first redistribution portion 110 and the semiconductor chip 120 may be bonded as wafer to wafer, at a wafer level.

Figure 10C:
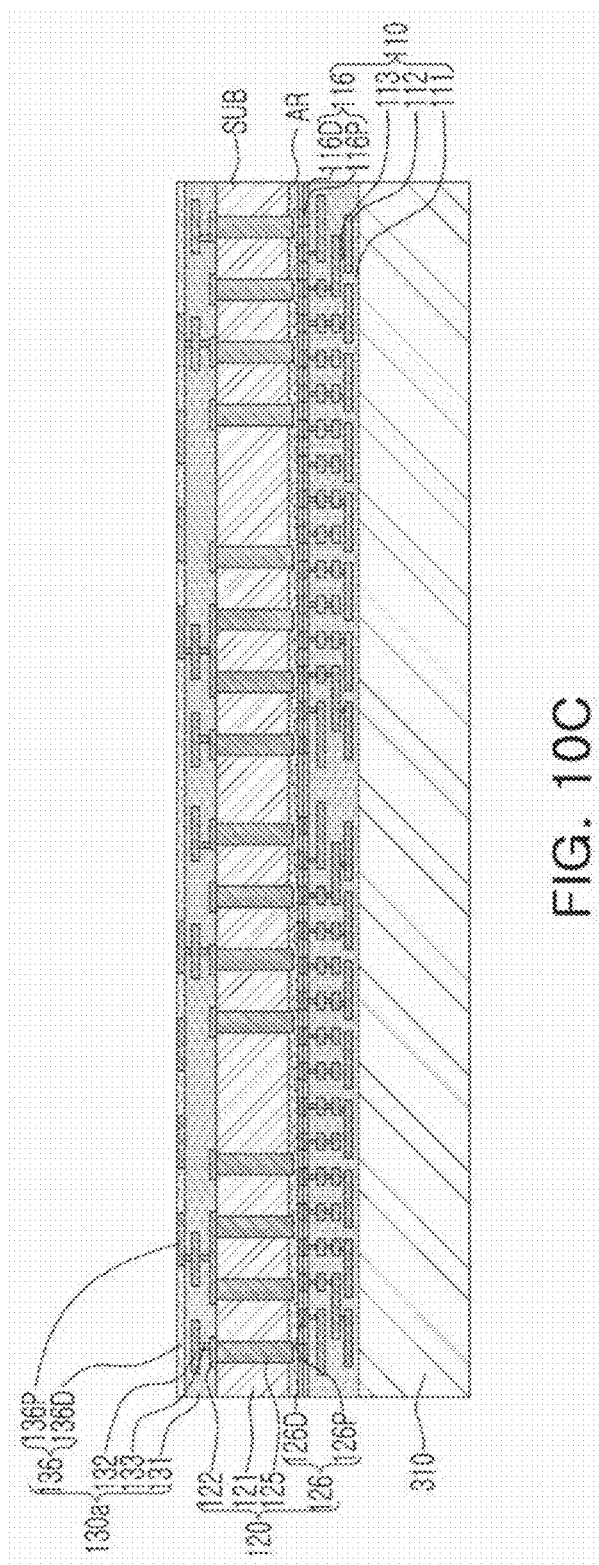

Referring to FIG. 10C, the semiconductor chip 120 is thinned, and a second redistribution portion 130a may be formed on the semiconductor chip 120.

A process for forming a second wiring insulating layer 131 to a predetermined thickness, a process for forming a via hole passing through a portion of the second wiring insulating layer 131, and a process for forming second vias 133 and second redistribution layers 132 on the second vias 133 by filling the via hole using a plating process, are repeatedly performed. Thus, a portion of a second redistribution portion 130a may be manufactured.

Then, a third bonding insulating layer 136D, having been patterned, is formed in an uppermost portion of the second redistribution portion 130a, and third metal pads 136P may be formed using a plating process in a patterned region, thereby forming a third bonding layer 136.

Figure 10D:
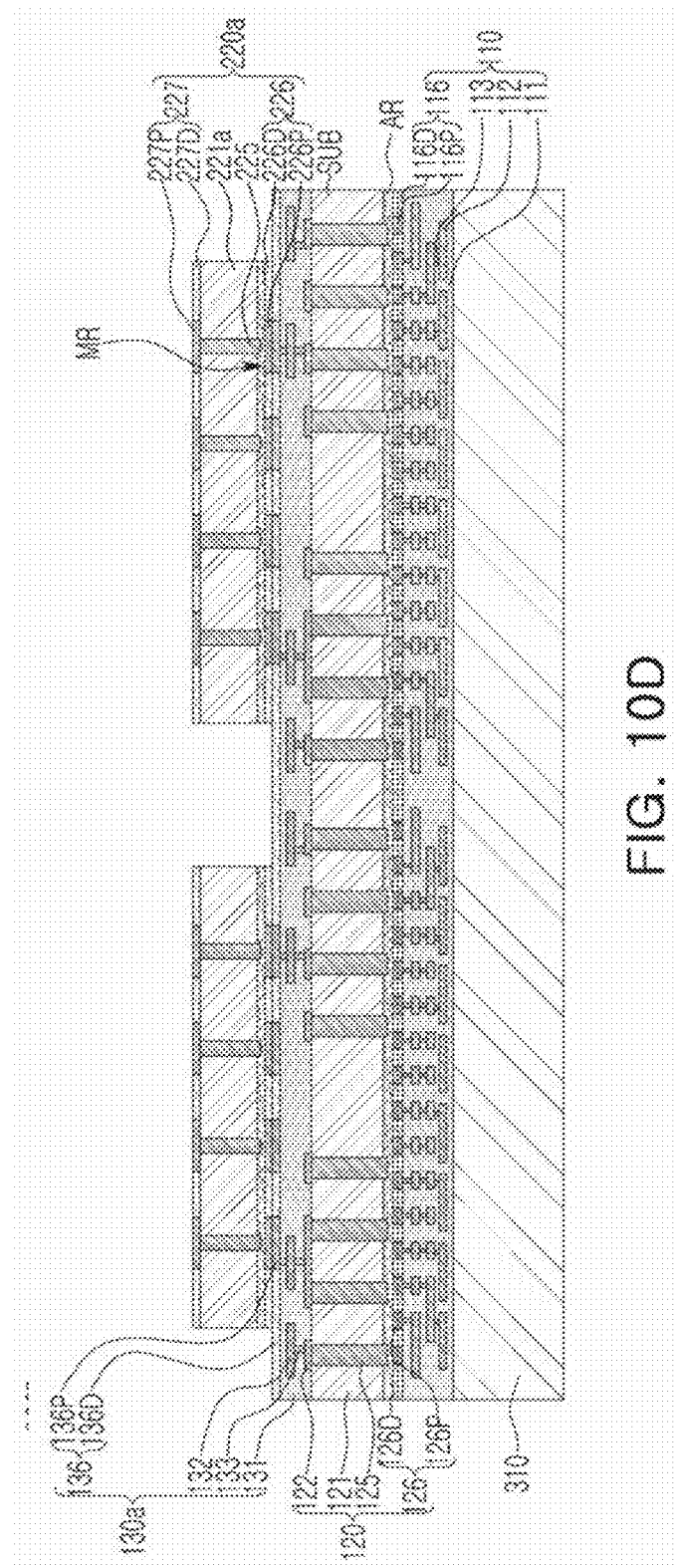

Referring to FIG. 10D, a first upper semiconductor chip 220a may be bonded to a stacked structure of the semiconductor chip 120 and the first redistribution portion 110 and the second redistribution portion 130a.

The first upper semiconductor chip 220a may be provided by forming an upper element region MR in the first upper body portion 221a, and forming upper through vias 225 passing through at least a portion of the first upper body portion 221a from the upper element region MR. Moreover, the first upper semiconductor chip 220a may be prepared by forming a fourth bonding layer 226 including fourth metal pads 226P and a fourth bonding insulating layer 226D on an active surface, and forming a fifth bonding layer 227 including fifth metal pads 227P and a fifth bonding insulating layer 227D on an inactive surface.

The first upper semiconductor chip 220a may be bonded to the second redistribution portion 130a by hybrid bonding the third bonding layer 136 to the fourth bonding layer 226. The second redistribution portion 130a and the first upper semiconductor chip 220a may be directly bonded by hybrid bonding without intervention of an adhesive such as a separate adhesive layer. A plurality of first upper semiconductor chips 220a may be bonded on the stacked structure of the semiconductor chip 120 and the first redistribution portion 110 and the second redistribution portion 130a.

Figure 10E:
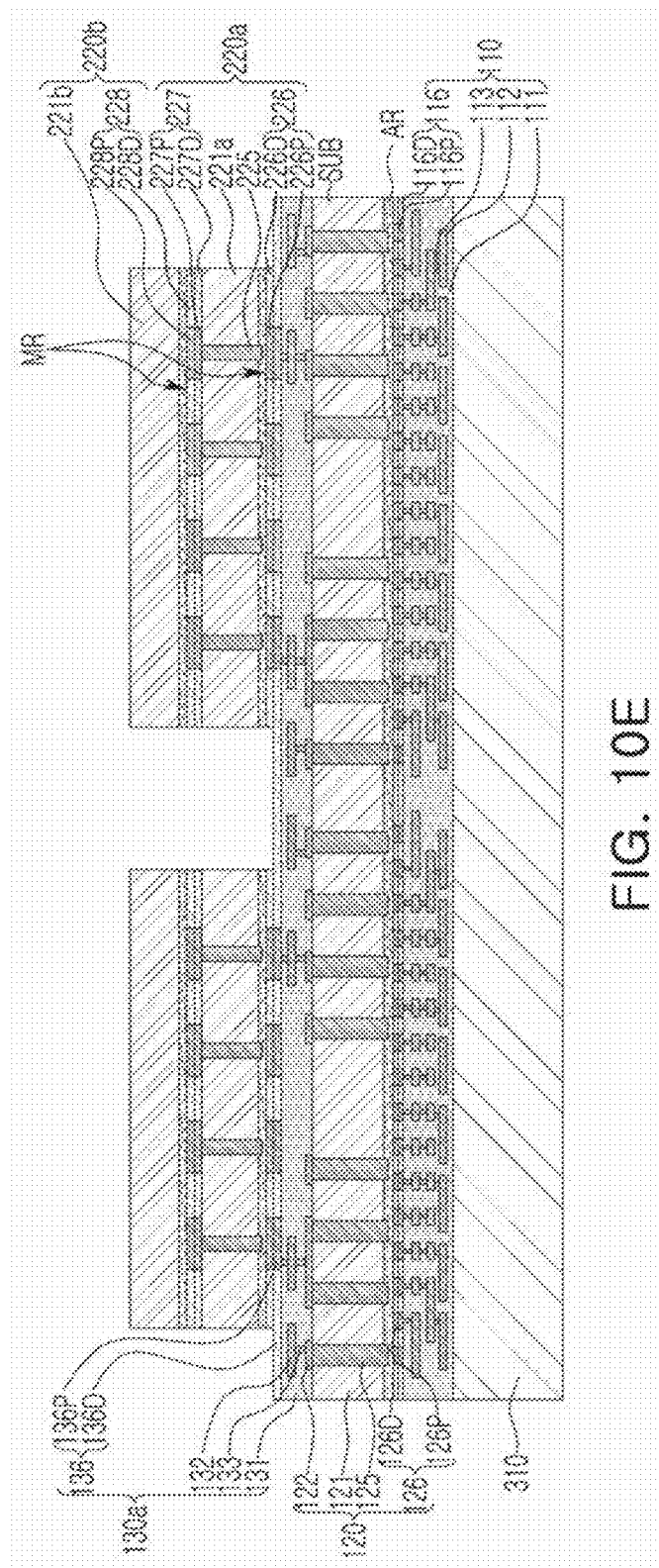

Referring to FIG. 10E, a second upper semiconductor chip 220b may be bonded to the first upper semiconductor chip 220a.

The second upper semiconductor chip 220b may be prepared by forming an upper element region MR in a second upper body portion 221b, and forming a sixth bonding layer 228 including sixth metal pads 228P and a sixth bonding insulating layer 228D on an active surface.

The second upper semiconductor chip 220b may be bonded to the first upper semiconductor chip 220a by hybrid bonding the fifth bonding layer 227 to the sixth bonding layer 228. The first upper semiconductor chip 220a and the second upper semiconductor chip 220b may be directly bonded by hybrid bonding without intervention of an adhesive such as a separate adhesive layer.

Figure 10F:
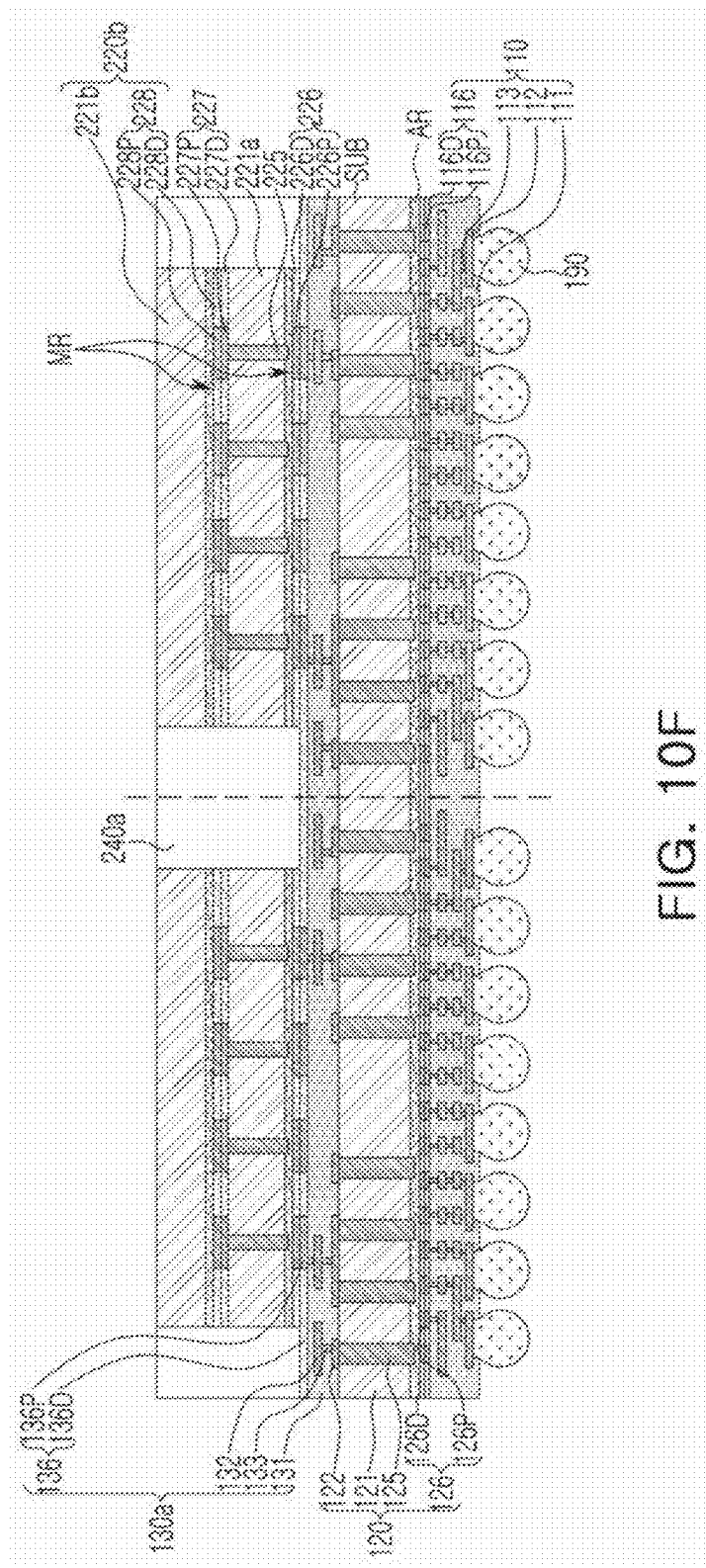

Referring to FIG. 10F, an encapsulation portion 240a encapsulating the first upper semiconductor chip 220a and the second upper semiconductor chip 220b is formed, a carrier substrate 310 is removed, and then connection terminals 190 may be formed in a lower portion of the first redistribution portion 110.

A material, forming the encapsulation portion 240a, is formed on the first upper semiconductor chip 220a and the second upper semiconductor chip 220b using a process such as lamination or applying and is then cured, thereby forming the encapsulation portion 240a. The applying method may be, for example, screen printing or spray printing.

The connection terminals 190 may be formed using a deposition or plating process and a reflow process.

Ultimately, as shown in FIG. 10F, the resulting product may be divided into respective semiconductor packages through a sawing process (alone dotted line in FIG. 10F), thereby manufacturing the semiconductor package 1000a of FIG. 5.

As set forth above, according to example embodiments, a redistribution portion and a semiconductor chip are connected by hybrid bonding, thereby providing a semiconductor package having a significantly reduced thickness and securing reliability.

While example embodiments have been shown and described above, it will be apparent to those skilled in the art that modifications and variations could be made without departing from the scope of the present disclosure, as defined by the appended claims.

What is claimed is:

1. A semiconductor package comprising:
a first semiconductor chip including a first body portion and through vias passing through at least a portion of the first body portion;
a first bonding layer disposed on a lower surface of the first semiconductor chip and including first metal pads and a first bonding insulating layer;
a first redistribution portion disposed on a lower surface of the first bonding layer, the first redistribution portion including first redistribution layers electrically connected to the first semiconductor chip, at least one first wiring insulating layer disposed between the first redistribution layers, and a second bonding layer connected to the first bonding layer and including second metal pads and a second bonding insulating layer;
a second redistribution portion disposed on an upper surface of the first semiconductor chip, the second redistribution portion including second redistribution layers electrically connected to the first redistribution layers, at least one second wiring insulating layer disposed between the second redistribution layers, and a third bonding layer; and
a second semiconductor chip disposed on the second redistribution portion, the second semiconductor chip including a second body portion and a fourth bonding layer connected to the third bonding layer,
wherein a lower surface of the first bonding insulating layer is bonded to an upper surface of the second bonding insulating layer, an upper surface of the first bonding insulating layer contacts the first body portion, and a lower surface of the second bonding insulating layer contacts the at least one second wiring insulating layer, and
wherein a width of the first redistribution portion is greater than a width of the first semiconductor chip.

2. The semiconductor package of claim 1, wherein the first bonding layer is disposed on an entirety of a lower surface of the first body portion and extends outside of the first semiconductor chip, and
the second bonding layer is disposed on an entirety of an uppermost surface of the at least one first wiring insulating layer such that the second bonding layer constitutes an upper surface of the first redistribution portion.

3. The semiconductor package of claim 1, wherein the first semiconductor chip has a size smaller than a size of the semiconductor package on a plane.

4. The semiconductor package of claim 1, wherein a side surface of the first redistribution portion is exposed externally.

5. The semiconductor package of claim 1, further comprising:
a lower encapsulation portion encapsulating the first semiconductor chip between the first redistribution portion and the second redistribution portion.

6. The semiconductor package of claim 1, wherein the second semiconductor chip is provided as a plurality of second semiconductor chips disposed to be side by side.

7. The semiconductor package of claim 1, wherein the first semiconductor chip is a logic semiconductor chip, and the second semiconductor chip is a memory semiconductor chip.

8. The semiconductor package of claim 1, wherein the first metal pads and the second metal pads include at least one among tungsten (W), aluminum (Al), copper (Cu), tungsten nitride (WN), tantalum nitride (TaN), and titanium nitride (TiN), and
the first bonding insulating layer and the second bonding insulating layer include at least one among SiO, SiN, SiCN, SiOC, SiON, and SiOCN.

9. The semiconductor package of claim 1, further comprising:
a core layer disposed to surround at least a portion of the first semiconductor chip on the first redistribution portion.

10. The semiconductor package of claim 1, wherein the first metal pads and the second metal pads are disposed to correspond to each other and bonded to each other, respectively, and
the first bonding insulating layer and the second bonding insulating layer surround the first metal pads and the second metal pads, respectively.

11. The semiconductor package of claim 10, wherein the upper surface and the lower surface of the first bonding insulating layer are coplanar with upper surfaces and lower surfaces of the first metal pads, respectively, and
the upper surface and the lower surface of the second bonding insulating layer are coplanar with upper surfaces and lower surfaces of the second metal pads, respectively.

12. The semiconductor package of claim 1, wherein the third bonding layer and the fourth bonding layer include third metal pads and fourth metal pads disposed to correspond to each other and bonded to each other, respectively, and
a third bonding insulating layer and a fourth bonding insulating layer surround the third metal pads and the fourth metal pads, respectively.

13. The semiconductor package of claim 12, wherein an upper surface of the third bonding insulating layer is bonded to a lower surface of the fourth bonding insulating layer, a lower surface of the third bonding insulating layer contacts the at least one second wiring insulating layer, and an upper surface of the fourth bonding insulating layer contacts the second body portion.

14. The semiconductor package of claim 12, wherein an upper surface and a lower surface of the third bonding insulating layer are coplanar with upper surfaces and lower surfaces of the third metal pads, respectively, and
an upper surface and a lower surface of the fourth bonding insulating layer are coplanar with upper surfaces and lower surfaces of the fourth metal pads, respectively.

15. A semiconductor package comprising:
a first semiconductor chip including a first body portion and through vias passing through at least a portion of the first body portion;
a first bonding layer disposed on a lower surface of the first semiconductor chip and including first metal pads and a first bonding insulating layer;
a first redistribution portion disposed on a lower surface of the first bonding layer, the first redistribution portion including first redistribution layers electrically connected to the first semiconductor chip, at least one first wiring insulating layer disposed between the first redistribution layers, and a second bonding layer connected to the first bonding layer and including second metal pads and a second bonding insulating layer;

a second redistribution portion disposed on an upper surface of the first semiconductor chip, the second redistribution portion including second redistribution layers electrically connected to the first redistribution layers, at least one second wiring insulating layer disposed between the second redistribution layers, and a third bonding layer;

second semiconductor chips disposed side by side on the second redistribution portion, each including a second body portion and a fourth bonding layer connected to the third bonding layer; and a core via disposed between the first redistribution portion and the second redistribution portion and electrically connect the first redistribution layers and the second redistribution layers, wherein an upper surface of the first bonding insulating layer is coplanar with upper surfaces of the first metal pads, and a lower surface of the second bonding insulating layer is coplanar with lower surfaces of the second metal pads, and wherein a width of the first redistribution portion is greater than a width of the first semiconductor chip.

16. The semiconductor package of claim 15, a lower surface of the first bonding insulating layer is bonded to an upper surface of the second bonding insulating layer, the upper surface of the first bonding insulating layer contacts the first body portion, and the lower surface of the second bonding insulating layer contacts the at least one second wiring insulating layer.

17. The semiconductor package of claim 15, further comprising:
 a lower encapsulation portion encapsulating the first semiconductor chip between the first redistribution portion and the second redistribution portion,
 wherein the core via passes through the lower encapsulation portion.

18. The semiconductor package of claim 15, wherein a lower surface of the first bonding insulating layer is coplanar with lower surfaces of the first metal pads, and
 an upper surface of the second bonding insulating layer is coplanar with upper surfaces of the second metal pads.

19. The semiconductor package of claim 15, further comprising:
 a core insulating layer spaced apart from the first semiconductor chip and surrounding the first semiconductor chip,
 wherein the core via passes through at least a portion of the core insulating layer.

20. The semiconductor package of claim 19, further comprising:
 a core wiring layer embedded in the core insulating layer and connected to the core via.

* * * * *